United States Patent
Kaplenko et al.

(10) Patent No.: US 12,211,666 B2
(45) Date of Patent: Jan. 28, 2025

(54) DATA ACQUISITION AND PROCESSING TECHNIQUES FOR THREE-DIMENSIONAL RECONSTRUCTION

(71) Applicant: FEI Company, Hillsboro, OR (US)

(72) Inventors: Oleksii Kaplenko, Brno (CZ); Tomáš Vystavěl, Brno (CZ); Petr Wandrol, Brno (CZ); Ondřej Machek, Brno (CZ)

(73) Assignee: FEI Company, Hillsboro, OR (US)

( * ) Notice: Subject to any disclaimer, the term of this patent is extended or adjusted under 35 U.S.C. 154(b) by 416 days.

(21) Appl. No.: 17/559,762

(22) Filed: Dec. 22, 2021

(65) Prior Publication Data

US 2022/0208508 A1 Jun. 30, 2022

Related U.S. Application Data

(60) Provisional application No. 63/131,962, filed on Dec. 30, 2020.

(51) Int. Cl.
*H01J 37/22* (2006.01)
*G06N 3/045* (2023.01)
*G06T 7/00* (2017.01)
*H01J 37/244* (2006.01)

(52) U.S. Cl.
CPC ............ *H01J 37/222* (2013.01); *G06N 3/045* (2023.01); *G06T 7/97* (2017.01); *H01J 37/244* (2013.01); *G06T 2207/10056* (2013.01); *G06T 2207/20084* (2013.01)

(58) Field of Classification Search
None
See application file for complete search history.

(56) References Cited

U.S. PATENT DOCUMENTS

| | | | |
|---|---|---|---|
| 2014/0131575 A1 | 5/2014 | Uemoto et al. | |
| 2015/0069233 A1* | 3/2015 | Anderson | H01J 37/222 250/307 |
| 2018/0204647 A1* | 7/2018 | Fullagar | G21K 7/00 |
| 2018/0328905 A1* | 11/2018 | Jacobi | G01N 23/2251 |
| 2019/0051492 A1* | 2/2019 | Potocek | H01J 37/317 |
| 2020/0312611 A1 | 10/2020 | Potocek et al. | |

OTHER PUBLICATIONS

European Patent Office Extended Search Report for Application No. 21214241.8 dated May 23, 2022 (9 pages).
Rowenhorst D.J., et al., "Characterization of Microstructure in Additively Manufactured 316L using Automated Serial Sectioning," Current Opinion in Solid State and Materials Science, Elsevier Science Ltd, Oxford, GB, vol. 24, No. 3, Jun. 1, 2020 (Jun. 1, 2020), XP086251242, ISSN: 1359-0286, DOI: 10.1016/J.COSSMS.2020. 100819.

* cited by examiner

*Primary Examiner* — Andrew Smyth
(74) *Attorney, Agent, or Firm* — Michael Best & Friedrich LLP

(57) ABSTRACT

Apparatuses and processes for generating data for three-dimensional reconstruction are disclosed herein. An example method at least includes exposing a subsequent surface of a sample, acquiring an image of the subsequent surface, comparing the image of the subsequent surface to an image of a reference surface, based on the comparison exceeding a threshold, acquiring a compositional or crystalline map of the subsequent surface, and based on the comparison not exceeding the threshold, exposing a next surface.

17 Claims, 7 Drawing Sheets

DATA ACQUISITION AND PROCESSING TECHNIQUES FOR THREE-DIMENSIONAL RECONSTRUCTION

This application claims priority from U.S. Provisional Application No. 63/131,962 filed Dec. 30, 2020 which is hereby incorporated by reference.

FIELD OF THE INVENTION

The invention relates generally to charged particle microscopes, and specifically to sample processing for three-dimensional reconstruction in a charged particle microscope.

BACKGROUND OF THE INVENTION

Charged particle microscopes can be used for a litany of imaging and analysis techniques. One technique, simply referred to as slice-and-view, includes data collection on a sequence of surfaces of a sample where a layer of the sample is removed after data is collected on an exposed surface. This technique is widely used in material research and biological sample analysis, for example, and can provide a reconstructed volume of the sample after some image processing. While this technique may not be too time consuming if only images are acquired, the acquisition of other types of data, such as compositional or crystalline data, increases the time needed to obtain the desired data. For example, if a sample volume is processed that includes hundreds of layers and the desired data includes both images and elemental information, then the processing time can be greatly increased into days or weeks of time.

While there are prior attempts at improving the throughput, those attempts still have their issues. One prior solution includes acquiring elemental information, for example, at every n surfaces while imaging each surface. Clearly this can improve process time, but the elemental data is limited, and may not capture changes to the sample. Obviously the choice of n can affect the coverage of the elemental data, but at a cost of process time, i.e., throughput. Although other potential solutions may exist, there is still a desire to provide full data sets of both images and compositional and/or crystalline information with a fast process time.

SUMMARY

Apparatuses and processes for generating data for three-dimensional reconstruction are disclosed herein. An example method at least includes exposing a subsequent surface of a sample, acquiring an image of the subsequent surface, comparing the image of the subsequent surface to an image of a reference surface, based on the comparison exceeding a threshold, acquiring a compositional or crystalline map of the subsequent surface, and based on the comparison not exceeding the threshold, exposing a next surface An example apparatus at least includes an electron column coupled to provide an electron beam, a focused ion beam column coupled to provide an focused ion beam, at plurality of detectors arranged to at least detect secondary electrons, x-rays, and backscattered electrons, and a controller coupled to at least the electron column, the focused ion beam column and each detector of the plurality of detectors. The controller including or coupled to code that, when executed by the controller, causes the apparatus to expose, by the focused ion beam, a subsequent surface of a sample, acquire an image of the subsequent surface, compare the image of the subsequent surface to a reference image, the reference image an image of a reference surface, based on the comparison exceeding a threshold, acquire a compositional or crystalline map of the subsequent surface, and based on the comparison not exceeding the threshold, expose a next surface.

BRIEF DESCRIPTION OF THE DRAWINGS

Like reference numerals refer to corresponding parts throughout the several views of the drawings.

DETAILED DESCRIPTION OF EMBODIMENTS

Figure 1:
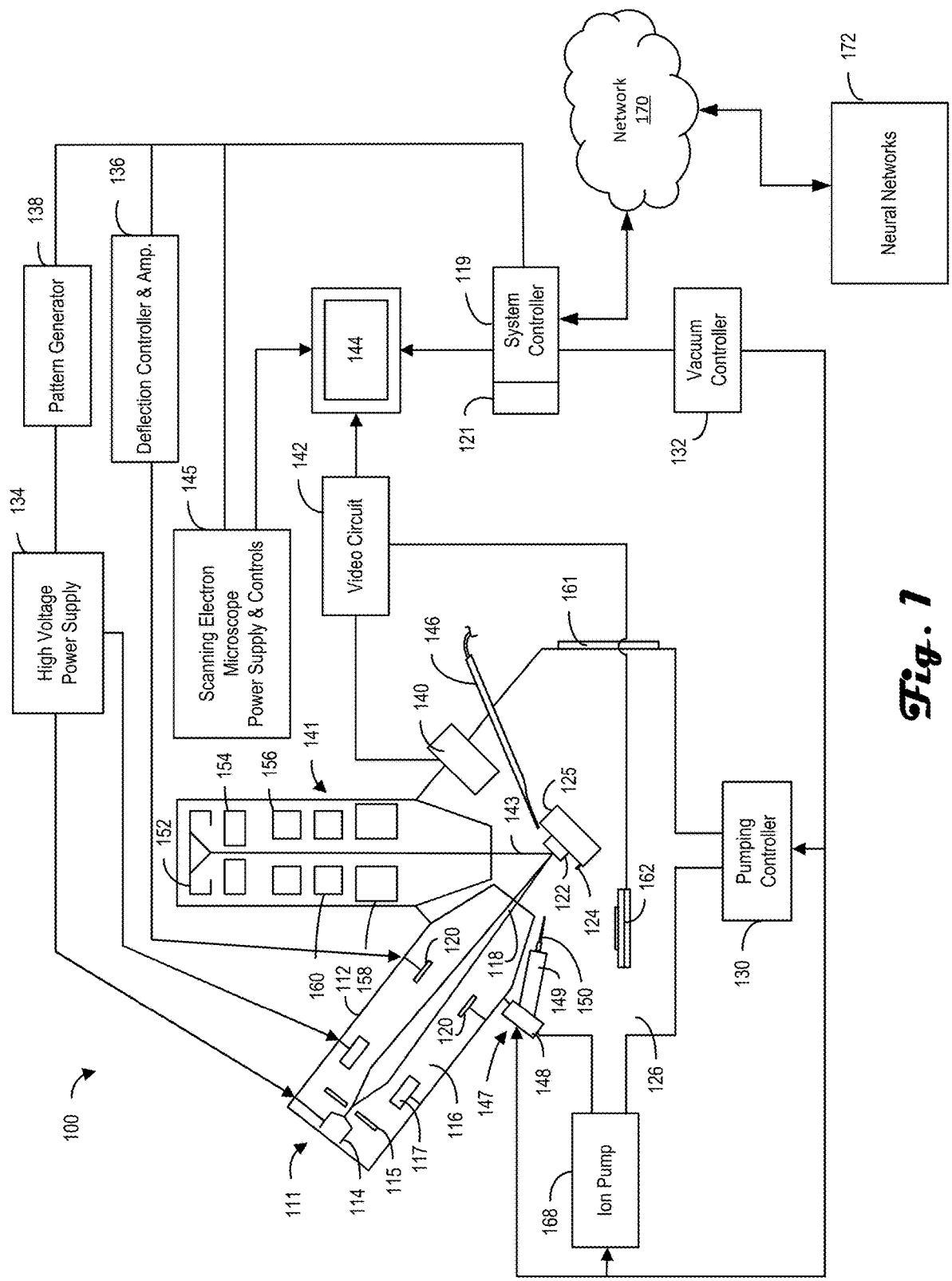
FIG. 1 is an example dual beam system for generating multi-data set 3D reconstructions in accordance with an embodiment of the present disclosure.

Embodiments of the present invention are described below in the context of a charged particle microscope generating a three-dimensional (3D) reconstruction of a sample using multiple data acquisition modalities so that the 3D reconstruction includes multiple data types. For example, a slice-and-view technique may be employed to image a plurality of surfaces of a sample, where each image is acquired after a layer of material is removed, and further including the periodic acquisition of compositional and/or crystalline maps of a subset of the surfaces. While not every surface may be mapped for composition or crystalline properties, a neural network is used to determine what surfaces to map based on changes to the images in reference to a threshold. Once or while the images and maps are being acquired, a second neural network is used to propagate the maps to the surfaces not having associated maps using the pixel values of the images to map to corresponding compositional or crystalline map quantities. Once all surfaces have an associated composition and/or crystalline map, a 3D reconstruction of all data types is available. It should be understood, however, that the methods described herein are generally applicable to a wide range of different tomographic methods and apparatus, including both cone-beam and parallel beam systems, and are not limited to any particular apparatus type, beam type, object type, length scale, or scanning trajectory As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and nonobvious features and aspects of the various disclosed embodiments, alone and in various combinations and subcombinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatuses are referred to as "lowest", "best", "minimum," or the like. It will be appreciated that such descriptions are intended to indicate that a selection among many used functional alternatives can be made, and such selections need not be better, smaller, or otherwise preferable to other selections.

Conventional techniques to generate 3D reconstruction data of samples can be time consuming, especially if multiple data types are desired for a full volume of sample. For example, if a slice-and-view method is implemented to acquire the desired data, the acquisition time, depending on size of the sample volume, may be substantial, ranging from days to weeks. Of course, if only images of each surface are desired, then the process time may not be an issue. However, if multiple types of data are desired for each exposed surface, then the acquisition time is drastically increased beyond acceptable times. Other than images, the other types of data could include compositional data and/or crystalline data. For example, compositional maps may be formed using energy dispersive x-ray spectroscopy (EDS), wavelength-dispersive spectroscopy (WDS), or cathodoluminescence (CL), to name a few, while crystalline maps may be formed using electron backscattered diffraction (EBSD). While acquiring multiple data types of each surface is possible, the processing time becomes excessive. Alternatively, a periodic acquisition of the slow data type, e.g., compositional or crystalline, may be performed at predetermined intervals while all surfaces are imaged. While this provides some of the slow data, such a process is performed agnostic to the sample, or changes thereof, and, as such, information may be missed. Accordingly, there is a continued desire to obtain multiple data at each surface so that multi-data 3D reconstructions are generated.

One solution may be to monitor images of each exposed surface and determine whether an amount of change in relation to a reference surface arises to significant change in the sample. If the change is deemed significant, a map (composition and/or crystalline) of the newly exposed surface is acquired along with the image. If the change is insignificant, however, a new surface is exposed and an image is acquired. The determination is then made again. As such, reference surfaces having associated reference sets of data are acquired based on changes in the sample. Once the sample is completely processed, the reference surface data sets are used to generate maps for the other surfaces that had only images acquired thereof. This interpolation may be performed using one or more neural networks that use the reference data sets and the images of the other surfaces to generate the interpolated maps. Once all surfaces have associated images and maps, either acquired or interpolated, multi-data set 3D reconstructions may be formed.

To further illustrate, a sample is processed using a slice-and-view technique that includes imaging and mapping a reference surface of the sample, removing a layer of the sample to expose a new surface, and then imaging the new surface. After the new surface is imaged, a neural network compares the image of the new surface to the image of the reference surface to determine if there has been significant change to the sample, such as the emergence of a new feature, or the expansion or contraction of a feature, to name a few examples. If the comparison indicates a significant change, then a map is also generated of the new surface, and this new surface becomes a current reference surface. However, if the comparison does not indicate significant change, then a new layer is removed, and the newly exposed surface is imaged. The current reference surface remains the reference surface (instead of being replaced), and the comparison of the image of the newly exposed layer to the reference image is performed. Then, based on the comparison, either a map of the newly exposed surface is generated or a subsequent surface is exposed. This process is repeated for a desired volume of the sample and results in a number of surfaces having both an associated image and an associated map, whereas the rest of the surfaces have only an associated image. Again, whether the surface has both an image and a map or just an image depends on the comparison of that surfaces image to the image of the most recent reference image, e.g., whether a significant change occurred.

Once the volume is processed, one or more additional neural networks can be used to generate maps of the surfaces having no associated map, where the generated maps are based on an interpolation from the surrounding reference maps and their corresponding image. For example, two adjacent reference surface images and maps can be used by the neural network to associate a pixel value of an image with a pixel value of a map. This association of pixel values may then be used to generate maps for surfaces having only an associated image based on the pixel values of those images. Once all surfaces have both images and maps, a 3D reconstruction of the sample of both the images and the maps may be formed.

The use of the neural networks to both determine when to acquire a map for a newly exposed surface and to generate the maps for surfaces having no associated maps enhances throughput of such a slice-and-view process while providing a full, robust data set.

Alternatively, the process may acquire a sparse crystalline and/or compositional map at each layer in addition to or instead of the decision-based map acquisition approach. A sparse map may be a map with fewer than all pixels having data and/or a fast acquisition time that results in noisy data. Then once the sample volume is fully processed, the layers having sparse maps may be processed through a neural network to produce full maps. The sparse map process may not increase processing time since the sparse maps may be acquired simultaneously with the acquisition of the image.

FIG. 1 is an example dual beam system 100 for generating multi-data set 3D reconstructions in accordance with an embodiment of the present disclosure. System 100 may be used to implement the data collection techniques discussed herein. In some embodiments, the system 100 will perform data acquisition and compositional and/or crystalline map interpolation to provide the 3d reconstruction. However, in other embodiments, system 100 will acquire the data and the map interpolation and 3D reconstruction will be performed by a separate computing system, such as at a user's desk or a cloud-based computing system. While an example of suitable hardware is provided below, the invention is not limited to being implemented in any particular type of hardware.

An SEM 141, along with power supply and control unit 145, is provided with the dual beam system 100. An electron beam 143 is emitted from a cathode 152 by applying voltage between cathode 152 and an anode 154. Electron beam 143 is focused to a fine spot by means of a condensing lens 156 and an objective lens 158. Electron beam 143 is scanned two-dimensionally on the specimen by means of a deflector 160. Operation of condensing lens 156, objective lens 158, and deflector 160 is controlled by power supply and control unit 145.

Electron beam 143 can be focused onto substrate 122, which is on stage 125 within lower chamber 126. Substrate 122 may be located on a surface of stage 125 or on TEM sample holder 124, which extends from the surface of stage 125. When the electrons in the electron beam strike substrate 122, secondary electrons are emitted. These secondary electrons are detected by detector(s) 140. In some embodiments, STEM detector 162, located beneath the TEM sample holder 124 and the stage 125 collects electrons that are transmitted through the sample mounted on the TEM sample holder.

System 100 also includes FIB system 111 which comprises an evacuated chamber having an ion column 112 within which are located an ion source 114 and focusing components 116 including extractor electrodes and an electrostatic optical system. The axis of focusing column 116 may be tilted, 52 degrees for example, from the axis of the electron column 141. The ion column 112 includes an ion source 114, an extraction electrode 115, a focusing element 117, deflection elements 120, which operate in concert to form focused ion beam 118. Focused ion beam 118 passes from ion source 114 through focusing components 116 and between electrostatic deflection means schematically indicated at 120 toward substrate 122, which may comprise, for example, a semiconductor wafer positioned on movable stage 125 within lower chamber 126. In some embodiments, a sample may be located on TEM grid holder 124, where the sample may be a chunk extracted from substrate 122. The chunk may then undergo further processing with the FIB in accordance with techniques disclosed herein.

Stage 125 can move in a horizontal plane (X and Y axes) and vertically (Z axis). Stage 125 can also tilt and rotate about the Z axis. In some embodiments, a separate TEM sample stage 124 can be used. Such a TEM sample stage will also preferably be moveable in the X, Y, and Z axes as well as tiltable and rotatable. In some embodiments, the tilting of the stage 125/TEM holder 124 may be in and out of the plane of the ion beam 118, and the rotating of the stage is around the ion beam 118.

A door 161 is opened for inserting substrate 122 onto stage 125. Depending on the tilt of the stage 124/125, the Z axis will be in the direction of the optical axis of the relevant column. For example, during a data gathering stage of the disclosed techniques, the Z axis will be in the direction, e.g., parallel with, the FIB optical axis as indicated by the ion beam 118. In such a coordinate system, the X and Y axis will be referenced from the Z-axis. For example, the X-axis may be in and out of the page showing FIG. 1, whereas the Y-axis will be in the page, all while all three axes maintain their perpendicular nature to one another.

An ion pump 168 is employed for evacuating neck portion 112. The chamber 126 is evacuated with turbomolecular and mechanical pumping system 130 under the control of vacuum controller 132. The vacuum system provides within chamber 126 a vacuum of between approximately $1 \times 10^{-7}$ Torr and $5 \times 10^{-4}$ Torr. If an etch assisting, an etch retarding gas, or a deposition precursor gas is used, the chamber background pressure may rise, typically to about $1 \times 10^{-5}$ Torr.

The high voltage power supply provides an appropriate acceleration voltage to electrodes in focusing column 116 for energizing and focusing ion beam 118. When it strikes substrate 122, material is sputtered, that is physically ejected, from the sample. Alternatively, ion beam 118 can decompose a precursor gas to deposit a material.

High voltage power supply 134 is connected to ion source 114 as well as to appropriate electrodes in ion beam focusing components 116 for forming an approximately 1 keV to 60 keV ion beam 118 and directing the same toward a sample. Deflection controller and amplifier 136, operated in accordance with a prescribed pattern provided by pattern generator 138, is coupled to deflection plates 120 whereby ion beam 118 may be controlled manually or automatically to trace out a corresponding pattern on the upper surface of substrate 122. In some systems the deflection plates are placed before the final lens, as is well known in the art. Beam blanking electrodes (not shown) within ion beam focusing column 116 cause ion beam 118 to impact onto blanking aperture (not shown) instead of substrate 122 when a blanking controller (not shown) applies a blanking voltage to the blanking electrode.

The ion source 114 typically provides an ion beam based on the type of ion source. In some embodiments, the ion source 114 is a liquid metal ion source that can provide a gallium ion beam, for example. In other embodiments, the ion source 114 may be plasma-type ion source that can deliver a number of different ion species, such as oxygen, xenon, and nitrogen, to name a few. The ion source 114 typically is capable of being focused into a sub one-tenth micrometer wide beam at substrate 122 or TEM grid holder 124 for either modifying the substrate 122 by ion milling, ion-induced etching, material deposition, or for the purpose of imaging the substrate 122.

Detectors 140 may be included for detecting various types of emission from the sample during processing and/or imaging. Such data may include secondary electrons, backscattered electrons, x-rays, and/or photons. For secondary electron detection, a detector, such as an Everhart Thornley or multi-channel plate, is connected to a video circuit 142 that supplies drive signals to video monitor 144 and receiving deflection signals from a system controller 119. For backscattered electron detection, an EBSD detector as is known in the art may be used. X-rays may be detected by an EDX or a WDS detector, and photons may be detected using any known optical detector tuned for various wavelength ranges. The location of the various detectors 140 within lower chamber 126 can vary in different embodiments.

A micromanipulator 147 can precisely move objects within the vacuum chamber. Micromanipulator 147 may comprise precision electric motors 148 positioned outside the vacuum chamber to provide X, Y, Z, and theta control of a portion 149 positioned within the vacuum chamber. The micromanipulator 147 can be fitted with different end effectors for manipulating small objects. In the embodiments described herein, the end effector is a thin probe 150.

A gas delivery system 146 extends into lower chamber 126 for introducing and directing a gaseous vapor toward substrate 122. For example, iodine can be delivered to enhance etching, or a metal organic compound can be delivered to deposit a metal.

System controller 119 controls the operations of the various parts of system 100. Through system controller 119, a user can cause ion beam 118 or electron beam 143 to be scanned in a desired manner through commands entered into a conventional user interface (not shown). Alternatively, system controller 119 may control system 100 in accordance with programmed instructions stored in a memory 121. Memory 121 may further include code for one or more neural networks to implement the techniques disclosed herein. In some embodiments, system 100 includes in memory 121, or is coupled to via network 170, one or more neural networks to assist with decision making and map interpolation/progression, both to be discussed in more detail below. The controller 119 may also be coupled to neural networks 172, which may be stored on one or more servers, via network 170. Network 170 may be an intranet, the internet, a local area network, or a wide area network, for example.

In operation in accordance with the techniques disclosed herein, system 100 performs a slice-and-view process on sample 122. The basic slice-and-view process includes imaging a surface of the sample using SEM 141 or FIB 111, where secondary and/or backscattered electrons emitted from the sample form the image, then removing a layer from the sample using the FIB 111 to expose a new surface. The new surface is then imaged, and the process repeats until a desired volume of the sample is imaged. In addition to the basic slice-and-view process, one or more of the surfaces may have compositional and/or crystalline maps formed thereof before or after the image of the surface has been captured. For example, one or more of the surfaces, based on a decision by a neural network on whether the sample is changing in terms of structure, make up, or morphology, may have an EDS and/or EBSD map obtained thereof.

To further illustrate, a surface of a sample is imaged with the SEM 141, and an EDS and/or an EBSD map is obtained of the same sample. This surface, since it has both an associated image and an associated map, may be referred to as a reference surface with associated reference data. After imaging and mapping, a layer of the sample is removed using the FIB 111 to mill away the layer, or slice, of the sample. Removal of the material results in exposing a new surface. This new surface is then imaged using the SEM 141, for example. A neural network then compares the image of the new surface to the image of the reference surface to determine if there has been significant change to the features visible in the image of the new surface. In some embodiments, significant change is based on a threshold criteria of a difference in the two images, where the threshold may be 0.5 on a scale from 0 to 1.0. For example, the appearance of a new structure or different morphology in the new image may be assigned a number greater than 0.5, based on the magnitude of the new feature/morphology, and the absence of such change would be assigned a number less than 0.5. Based on the comparison, the neural network determines what step system 100 is to perform next.

If the comparison shows that no significant change is present (e.g., the difference between the two images is less than 0.5), then system 100 removes another layer from the sample, again using the FIB 111, and images the newly exposed surface. It should be noted that other forms of layer removal may also be used, such as a microtome to slice of the layer, a laser to ablate the layer or broad ion beam slicing. All such layer removal techniques are considered herein.

If, however, the comparison shows that significant change is present (e.g., the difference between the two images is greater than or equal to 0.5), then an EDS and/or an EBSD map is obtained of the newly exposed surface. As such, this newly exposed surface becomes the current reference surface. Then, once the newly exposed surface is imaged and mapped, a new layer is removed and the process repeats. This sequence of imaging, decision making, layer removing, mapping, etc. repeats for a desired volume of the sample and, as a result, a variety of data is obtained for the sample volume. It should be noted that the variety of data will include a subset of surfaces having both associated images and maps while the remaining surfaces have only an associated image. At this point, a 3D reconstruction using only the images is possible, but there may be significant gaps in map data for a corresponding 3D reconstruction.

This lack of maps for each surface is cured by using one or more additional neural networks to form maps for the surfaces that do not have maps. For example adjacent reference surfaces and their associated reference data sets can be used to form EDS/EBSD maps for the surfaces without a map. To illustrate, the one or more neural networks can associate a map pixel value with an image pixel value based on the reference data sets, then use this association to generate maps for the surfaces without a map. As the data for the entire volume is processed, maps for each surface are obtained, where some surfaces have an associated acquired map and other surfaces have an associated interpolated map. Once each surface has a map, a corresponding 3D reconstruction may be obtained.

Alternatively or additionally, a sparse EDS and/or EBSD map may be acquired of each non-reference surface simultaneously with the acquisition of the image. Such sparse data may then be filled out when the reference maps are used to back propagate the map data to the non-reference surfaces.

Figure 2:
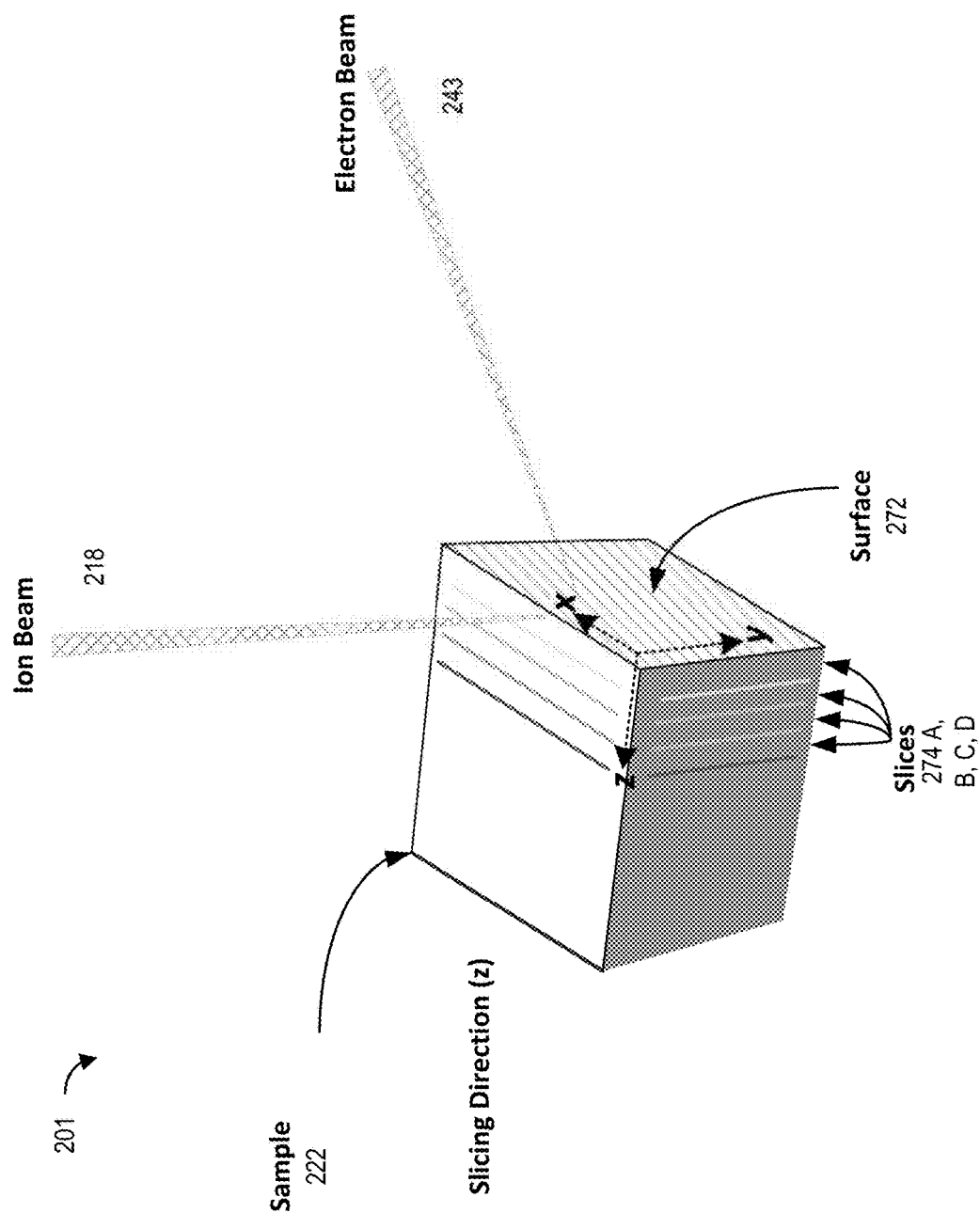
FIG. 2 2 is an example sample processing workflow in accordance with an embodiment of the present disclosure.

FIG. 2 is an example sample processing workflow 201 in accordance with an embodiment of the present disclosure. The workflow 201 illustrates a sample milling, imaging and data collection technique that can also be referred to as slice-and-view, as discussed above. In the disclosed technique, slice-and-view is used to obtain data on the sample to build 3D reconstructions that include multiple data types. The workflow 201 may be performed by a dual beam charged particle microscope, such as system 100 for example, and is more directed to the data gathering aspect of the disclosed techniques. The 3d reconstruction and data propagation aspects will be discussed in more detail below.

The workflow 201 is performed on sample 222, which is an example of sample 122, and which may be mounted on a stage, such as stage 125. Workflow 201 uses ion beam 218 to remove material from sample 222, and then images newly exposed surfaces 272 with electron beam 243. A newly exposed surface 272 will be formed after the removal of each layer or slice of sample 222. For example, ion beam 218 removes slice 274A exposing a new surface 272. The removal of slice 274A, and subsequent slices, can be performed by milling the slice away using the ion beam 218, or it can be removed using ion beam induced etching by bleeding a gas precursor to the surface 272, which then etches away the slice through interaction with the ion beam 218. Each slice may be on the order of 2 to 5 nanometers in thickness, but the size of the structures within sample 222 may determine the desired slice thickness. For example, smaller structures may require thinner slices, whereas larger structures can stand thicker slices. As the workflow progresses, slice 274B is removed then an image of the newly exposed surface 272 is acquired. This two-step process may then repeat for the removal of slices 247C and 274D.

In addition to the electron beam imaging, workflow 201 may further include obtaining compositional and/or crystalline maps of some of the surfaces, based on the decision discussed above. The maps may be acquired in response to the illumination of the surfaces to the electron beam and measuring either backscattered electrons, for EBSD maps, or measuring energies of emitted x-rays, for EDS maps. While not every surface may have an associated map, the workflow 201 outlines the general process to obtain images and maps of surface 272 of sample 222. The alternative or additional approach is to acquire a sparse compositional and/or crystalline map of each non-reference surface, where such sparse data can be complimented and combined with the back propagation of the reference maps.

Figure 3:
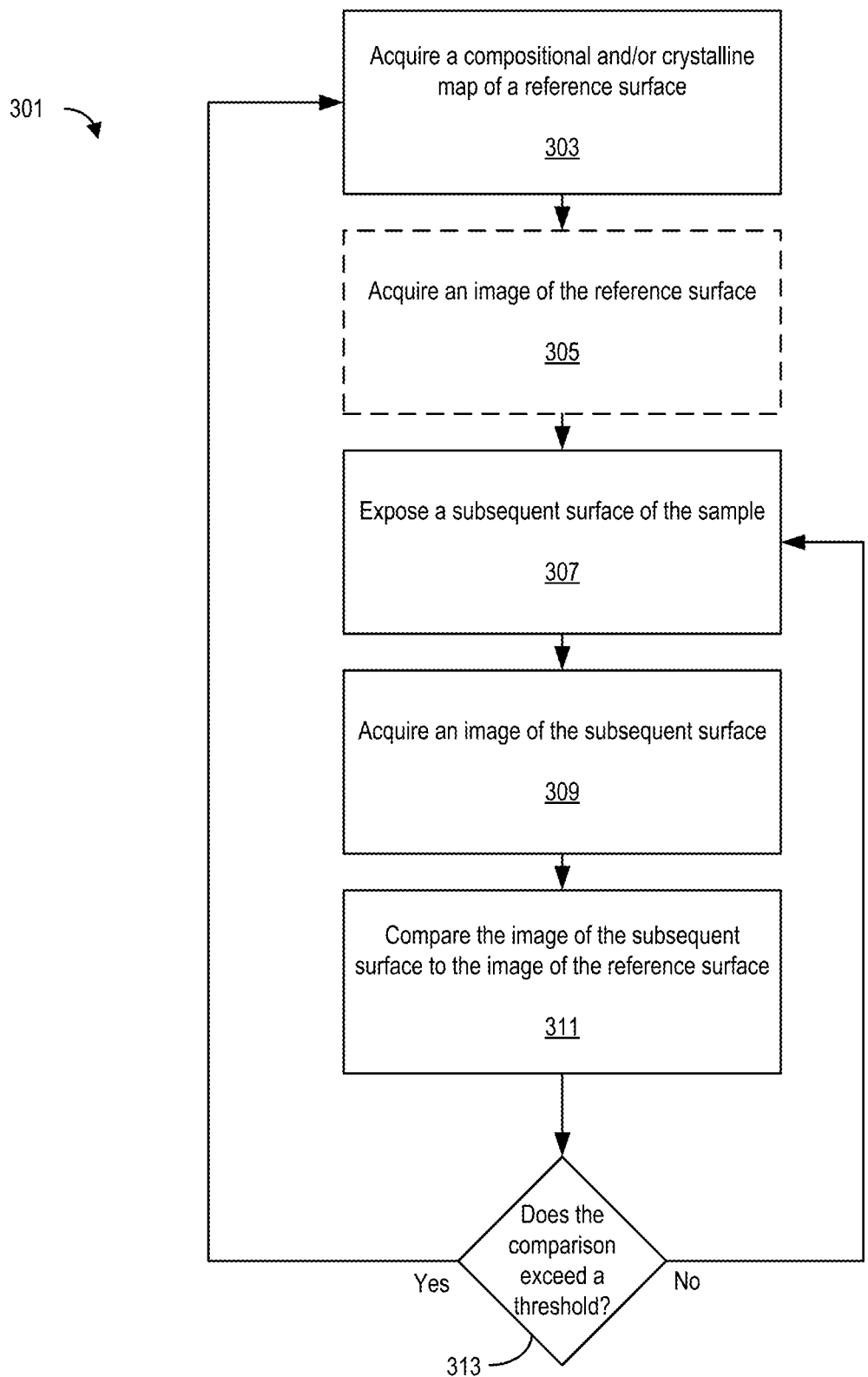
FIG. 3 is an example method for acquiring multi-modal data while processing a sample in accordance with an embodiment of the present disclosure.

FIG. 3 is an example method 301 for acquiring multimodal data while processing a sample in accordance with an embodiment of the present disclosure. The method 301 may be implemented in any type of microscope environment capable of obtaining multiple types of data of a sample. Example microscopes include the dual beam system 200. Regardless of the implementing microscope, method 301 acquires at least two types of data of a sample at a subset of surfaces and acquires only one type of data for the remaining surfaces. The method 301 outlines an embodiment of how to determine when to obtain the second type of data as a sample is being processed with a slice-and-view type workflow. The implementation of such technique results in 3D data of the sample of higher quality than currently obtainable and at a more efficient throughput. Of course, all types of data could be acquired for each surface, but such brute force technique fails to benefit from the disclosed technique.

Method 301 may begin at process block 303, which includes acquiring a compositional and/or crystallographic map of a surface of a reference surface of a sample. The acquisition of the composition and/or crystalline maps may be performed using a variety of data acquisition techniques, as discussed above, and at least include EDS, WDS, EBSD, and/or CL, for example, but other compositional or crystallographic techniques are also contemplated herein and are within the bounds of the present disclosure. In general, the techniques used to collect the maps may be referred to as a second modality, which is different from a first modality used in image acquisition processes. The acquired map provides a pixelated map of the sample relating to the composition of the sample at each pixel and/or the crystallographic orientation of the sample at each pixel. Such data may be used to construct associated 3D volumes of the sample once additional surfaces are exposed and imaged.

Figure 4:
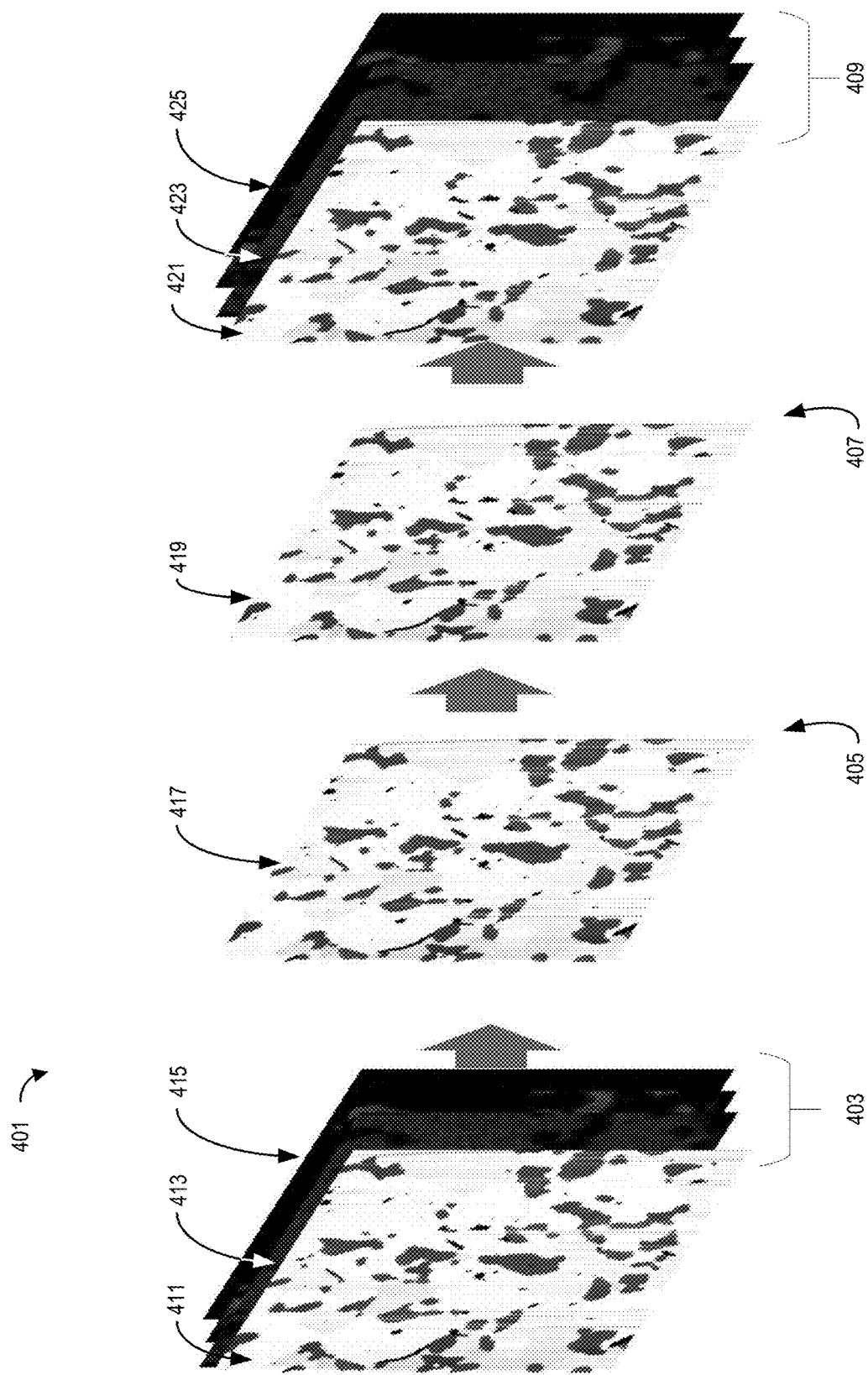
FIG. 4 is an illustrative image sequence in accordance with an embodiment disclosed herein.

Process block 303 may be followed by process block 305, which includes acquiring an image of the reference surface. The image may be acquired using a first modality, the first modality conventionally faster than the second modality. The first modality may be an SEM-acquired image or an FIB-acquired image of the surface, which provides more topographical-type information of the surface. This data is also used to generate 3D volumes of the sample. It should be noted that the sequence of process blocks 303 and 305 may be switched and the sequence shown in FIG. 4 is not required or limiting. It should also be noted that once an initial reference surface is acquired, process block 305 may not be performed post decision block 313 since an image may have already been obtained in process block 309.

Process block 305 may be followed by process block 307, which includes exposing a subsequent surface of the sample. Exposing the subsequent surface can include removing a layer of material from the sample using any available technique. For example, a FIB may be used to mill or etch away the layer to expose the subsequent surface. Alternatively, a laser may be used to ablate the layer of material, or a microtome may be used to slice off the layer of material. Regardless of the material removal technique utilized, the subsequent surface is exposed so that at least an image of the subsequent surface may be acquired.

Process block 307 may be followed by process block 309, which includes acquiring an image of the subsequent surface. The image is acquired using the first modality, as discussed above. The first modality may image using secondary and/or backscattered electrons emitted from the surface in response to irradiation of an electron beam (e.g., SEM-based imaging) or an FIB beam (e.g., FIB-based imaging). Regardless of the first modality, a grey scale image of the surface is acquired, where the difference in grey scale from pixel to pixel indicates differences in morphology and/or material.

It should be noted that in some examples of the method 301, sparse maps of compositional and/or crystalline data may be acquired concurrently with image acquisition steps 305 and 309. The sparse maps may have data on sparsely located areas of the sample surface. For example, as the image of the surface is acquired in a pixel by pixel strategy (e.g., by scanning an electron beam across the surface in a desired pattern with the beam dwelling a pixels, i.e., identifiable locations, on the surface) EDS and/or EBSD data may be acquired at a subset of the pixels to obtain a sparse map. This sparse data may then be augmented in the data propagation method 501, for example.

Process block 309 may be followed by process block 311, which includes comparing the image of the subsequent surface to the image of the reference surface. The comparison may be performed by one or more neural networks, such as a Siamese network, and may compare the images on a per pixel basis. In general, the comparison is to determine if there has been significant change to structures visible on the surface uncovered by the layer removal, which may be indicated in the images. As such, a significant difference in the images is determine by the comparison, where the significant difference is based on a threshold. For example, the comparison may determine a difference between the images, where a difference above a threshold, e.g., a threshold of 0.5 on a scale of 0 to 1, indicates a significant change. On the other hand, a difference below the threshold indicates no significant change. A difference value equal to the threshold also indicates a significant change.

Process block 311 may be followed by process block 313, which includes determining what process to execute next based on the comparison. If the comparison exceeds the threshold, then a compositional and/or crystalline map is acquired of the subsequent surface. As a result, the subsequent surface now has an associated image and an associated map(s). Additionally, the subsequent surface becomes a next reference surface. If, however, the comparison does not exceed the threshold, the method proceeds to process block 307 so that an additional surface is exposed.

The reference surface may alternatively be referred to as a current reference surface since it has both an image and one or more associated maps. In general, the method 301 includes data acquisition, both maps and images, of a subset of surfaces of the sample, where each surface of the subset of surfaces will have an associated image and crystalline/compositional map. The remaining surfaces may only have an associated image.

It should be noted that method 301 may be used to expose and image/map a large number of surfaces, where a subset of the surfaces will be reference surfaces since those surfaces will have an associated map and image. The remaining surfaces may only have an associated image. Each time the comparison exceeds the threshold, a new reference image is identified due to the changes in the surface morphology. It should be noted that there is no predetermined number or periodicity of the reference surfaces and the resulting reference surfaces are determined by the changes in the sample as it is processed. Additionally, as new reference surfaces are identified, surfaces exposed thereafter are compared to the new reference surface, not any of the previous reference surfaces.

FIG. 4 is an illustrative image sequence 401 in accordance with an embodiment disclosed herein. The image sequence 401 includes data of four sequential surfaces, where two of the surfaces have associated images and maps and the intervening surfaces have only associated images. The images and maps of image sequence 401 were acquired using the method 301 as implemented in a dual beam charged particle microscope, such as DB system 100.

Image sequence 401 includes data on surfaces 403, 405, 407 and 409. Surfaces 403 and 409 are reference surfaces and have associated images and maps, such as crystalline and compositional maps. For example, surface 403 has an associated image 411, and two associated compositional maps 413 and 415. The two compositional maps 413, 415 are of a single element, for example. While the compositional map for surface 403 is broken into two, one for each of two elements, such bifurcation of the maps is not necessary.

Surfaces 405 and 407 only have associated images, 417 and 419, respectively. Lastly, surface 409, similar to surface 403, has an associated image 421, and associated compositional maps 423 and 425.

The data associated with surfaces 403-409 may be a part of a larger data set for an associated sample and may be used to provide a multi-data set 3D reconstruction of the sample.

Figure 5:
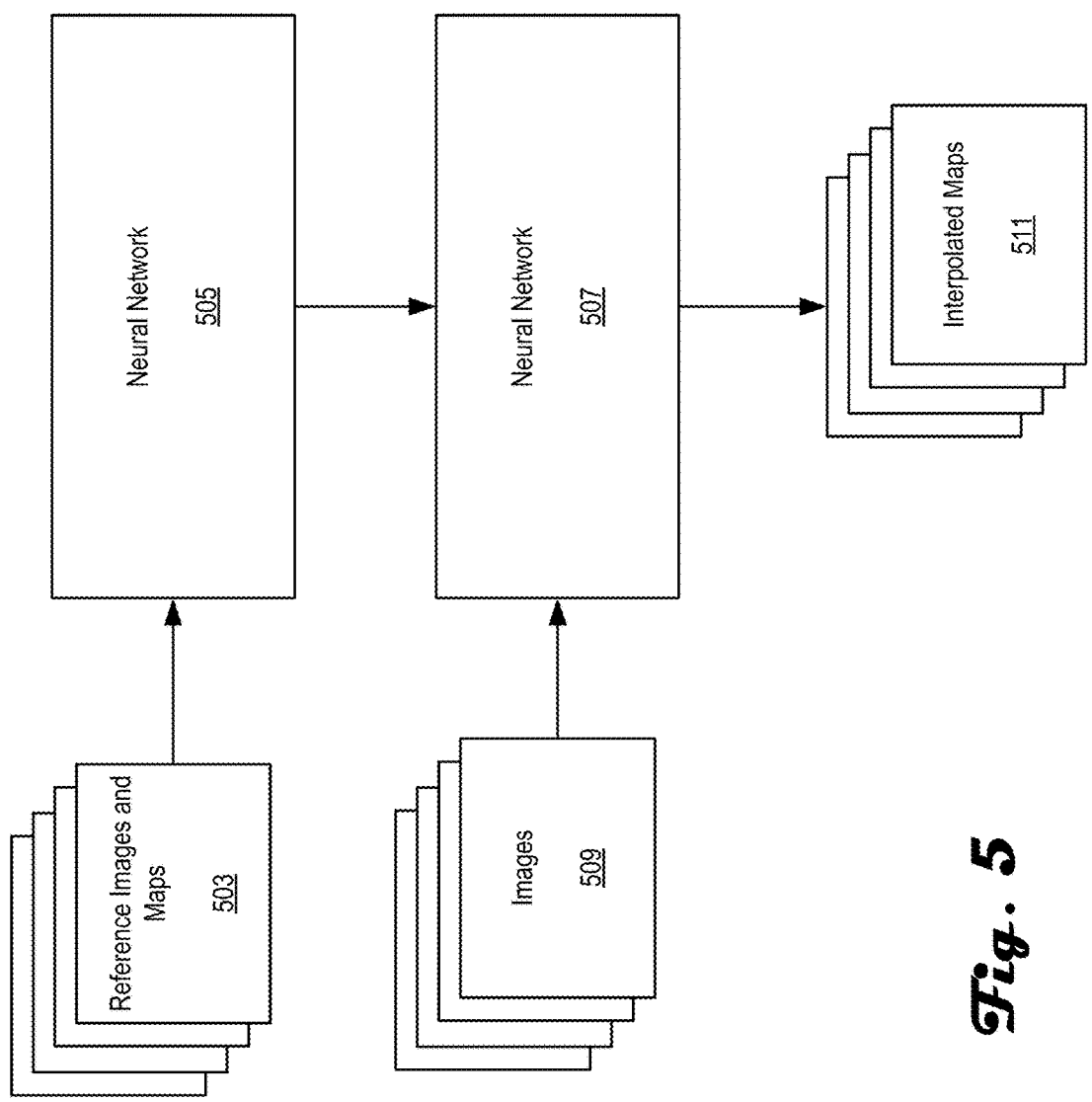
FIG. 5 is an example workflow for propagating crystalline and/or compositional maps to unmapped surfaces in accordance with am embodiment of the present disclosure.

FIG. 5 is an example workflow 501 for propagating crystalline and/or compositional maps to unmapped surfaces in accordance with an embodiment of the present disclosure. Workflow 501 may be performed in real time during a slice-and-view process as the data is obtained. Alternatively, workflow 501 may be performed after a sample is processed and all of the desired data has been obtained. In such an embodiment, the propagation of the maps may be performed by the microscope or at a user's desk with access to one or more neural networks. In general, the method 501 results in generating compositional maps for surfaces that have no associated acquired maps so that a 3D reconstruction with both images and compositional/crystalline maps is obtained.

Workflow 501 includes reference images and maps 503, neural networks 505 and 507, images 509, and interpolated maps 511. The reference images and maps 503 are images and crystalline/compositional maps of a subset of surfaces of a sample, which have been identified as reference surfaces. As such, each reference surface has an associated image and crystalline and/or compositional map. Additionally, the reference surfaces and their associated images/maps may be in an order from a first reference surface to an nth reference surface such that the first and second reference surfaces have one or more interstitial surfaces between them. In general, other than the first and nth reference surfaces, each reference surface may have a preceding and a subsequent reference surface. For ease of discussion, each reference surface will have a set of data, an image and one or more maps, and such a unit of data will be referred to as $RS_i$, where RS means Reference Set, and the i indicates the identity of the reference surface. In general, the reference sets can be identified as $RS_{i-1}$, $RS_i$ and $RS_{i+1}$.

On the other hand, images 509 are images of the interstitial surfaces that may not have an associated map, either crystalline or compositional. As such, each of the interstitial surfaces has two corresponding reference surfaces—one that precedes it and one subsequent. The images 509 may likewise be referenced using a naming convention, such as $I_1, I_2, I_3, \ldots, I_m$, or more generally as $I_j$, where j gores from 1 to m. As discussed previously in some examples, the interstitial surfaces may also have a sparse map of compositional and/or crystalline information that can be augmented using the interpolation process disclosed with workflow 501.

In general, there is a plurality of surfaces imaged, such as using method 301, where a subset of those surfaces is also mapped. The remaining surfaces either have only an associated image. The subset of surfaces that have both an associated image and associated map will be the reference images used to form maps, using the neural networks 505 and 507, for the surfaces having only an image. The neural networks 505 and 507 may both be U-Nets, as in known in the art, and have been trained using similar data.

In operation, neural network 505 receives the reference images and maps 503 as inputs and determines a bidirectional optical flow from $RS_i$ to $RS_{i+1}$, for example. The bidirectional optical flow essentially associates map pixel values with the associated image pixel values using the two sets of data. This mapping is then used as an input to neural network 507, which also receives images 509 as an input. Subsequently, neural network 505 the produces a refined bidirectional optical flows between $RS_i$ and an image $I_j$, and between $I_j$ and $RS_{i+1}$, $I_j$ is a surface between surfaces associated with $RS_i$ and $RS_{i+1}$. Neural network 507 further produces visibility maps for each pixel in $RS_i$ and $RS_{i+1}$. As a result, and by applying the refined optical flow and visibility maps to the maps, interpolated maps for each interstitial surface (having only an image 509) may be obtained from workflow 501.

Viewed from a different lens, the workflow 501 associates grey scale pixel values of images with compositional/crystalline map pixel values, then uses this association to generate maps for each image in images 509. As a final result, each surface of a sample will have both associated maps and images, where some maps are acquired and some maps are interpolated.

Figure 6:
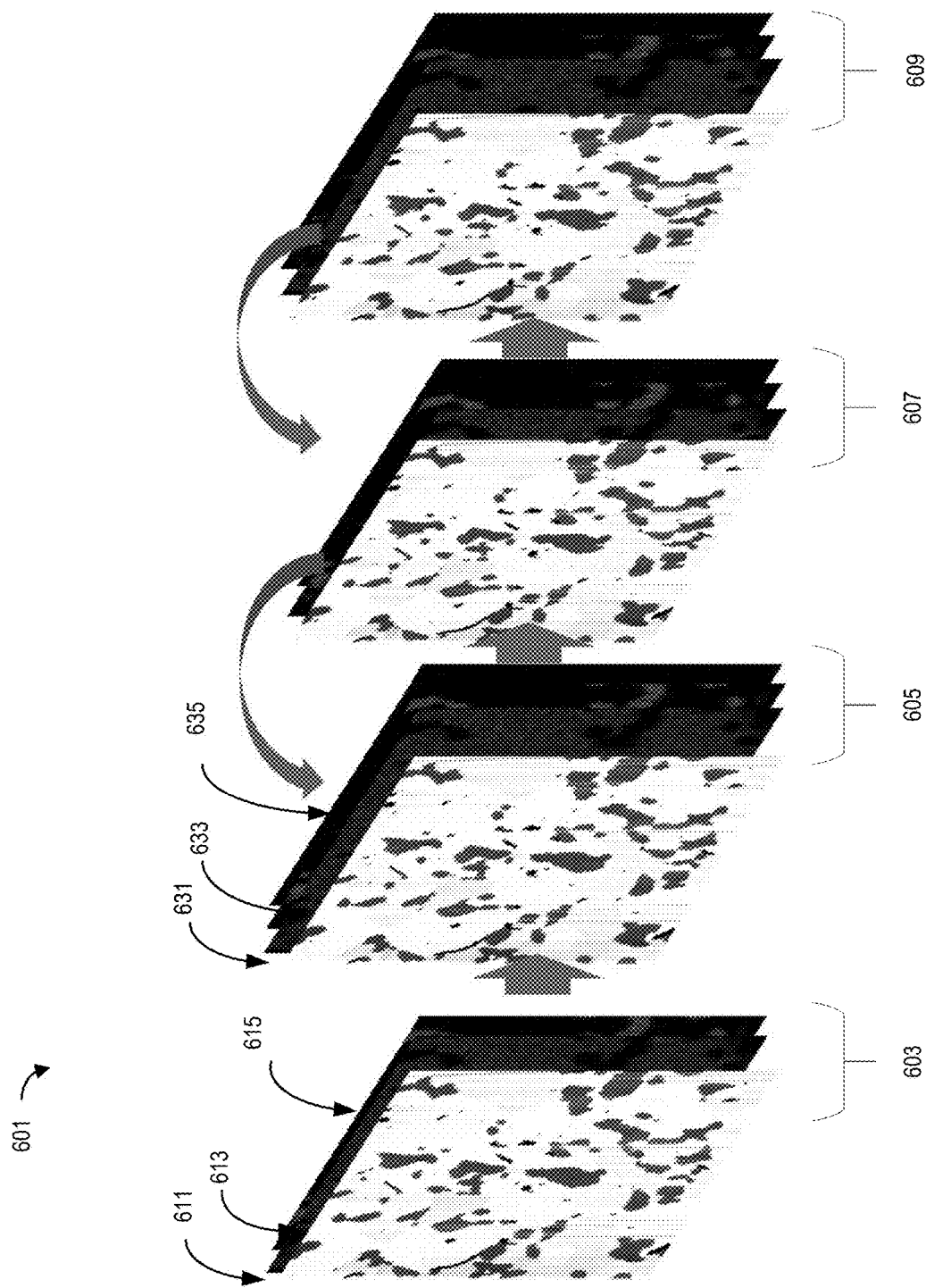
FIG. 6 is an illustrative image sequence in accordance with an embodiment of the present disclosure.

FIG. 6 is an illustrative image sequence 601 in accordance with an embodiment of the present disclosure. The image sequence 601 may be a continuation of image sequence 401 that includes interpolated maps, for example. Surfaces 605 and 607 may have interpolated maps generated using workflow 501, for example. For example, images and maps for surfaces 603 and 609 along with images for surfaces 605 and 607 may be provided to workflow 501 so that maps 633 and 635 may be interpolated for surface 605. Similarly, surface 607 may also have interpolated maps generated. In general, the images and maps for RS 603 and 609 may be used to generate the interpolated maps for surfaces 605 and 607.

Figure 7:
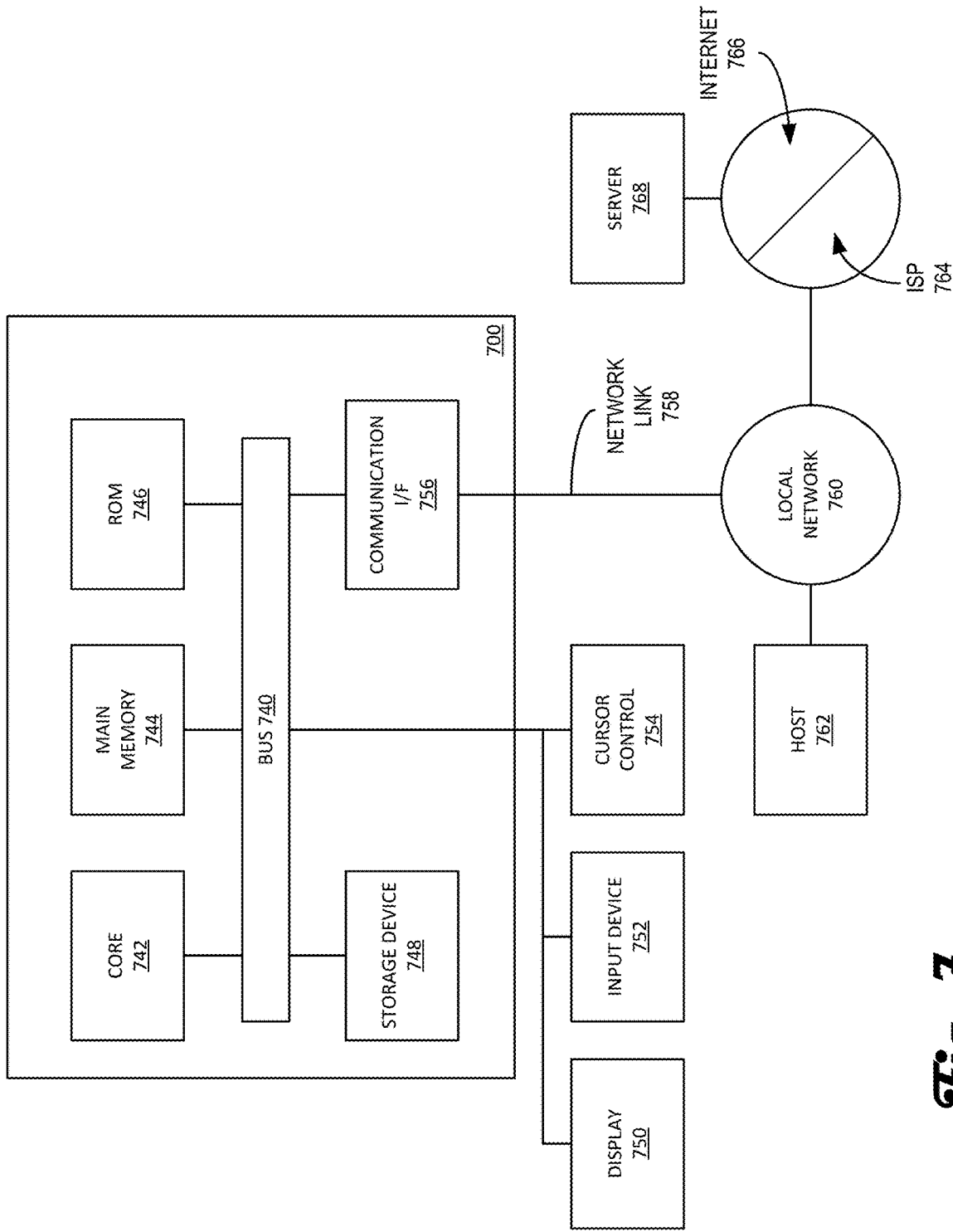
FIG. 7 is an example functional block diagram in accordance with an embodiment of the present disclosure.

FIG. 7 is an example functional block diagram 700 in accordance with an embodiment of the present disclosure. FIG. 7 is a block diagram that illustrates a computer system 700 that an embodiment of the invention may include. The computing system 700 may be an example of computing hardware included with system 100, such as controller 119. Computer system 700 at least includes a bus 740 or other communication mechanism for communicating information, and a hardware processor 742 coupled with bus 740 for processing information. Hardware processor 742 may be, for example, a general purpose microprocessor. The computing system 700 may be used to implement the methods and techniques disclosed herein, such as methods 301 and 401, and may also be used to obtain images and segment said images with one or more classes.

Computer system 700 also includes a main memory 744, such as a random access memory (RAM) or other dynamic storage device, coupled to bus 740 for storing information and instructions to be executed by processor 742. Main memory 744 also may be used for storing temporary variables or other intermediate information during execution of instructions to be executed by processor 742. Such instructions, when stored in non-transitory storage media accessible to processor 742, render computer system 700 into a special-purpose machine that is customized to perform the operations specified in the instructions.

Computer system 700 further includes a read only memory (ROM) 746 or other static storage device coupled to bus 740 for storing static information and instructions for processor 742. A storage device 748, such as a magnetic disk or optical disk, is provided and coupled to bus 740 for storing information and instructions.

Computer system 700 may be coupled via bus 740 to a display 750, such as a cathode ray tube (CRT), for displaying information to a computer user. An input device 752, including alphanumeric and other keys, is coupled to bus 740 for communicating information and command selections to processor 742. Another type of user input device is cursor control 754, such as a mouse, a trackball, or cursor direction keys for communicating direction information and command selections to processor 742 and for controlling cursor movement on display 750. This input device typically has two degrees of freedom in two axes, a first axis (e.g., x) and a second axis (e.g., y), that allows the device to specify positions in a plane.

Computer system 700 may implement the techniques described herein using customized hard-wired logic, one or more ASICs or FPGAs, firmware and/or program logic which in combination with the computer system causes or programs computer system 700 to be a special-purpose machine. According to one embodiment, the techniques herein are performed by computer system 700 in response to processor 742 executing one or more sequences of one or more instructions contained in main memory 744. Such instructions may be read into main memory 744 from another storage medium, such as storage device 748. Execution of the sequences of instructions contained in main memory 744 causes processor 742 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical or magnetic disks, such as storage device 748. Volatile media includes dynamic memory, such as main memory 744. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, content-addressable memory (CAM), and ternary content-addressable memory (TCAM).

Storage media is distinct from but may be used in conjunction with transmission media. Transmission media participates in transferring information between storage media. For example, transmission media includes coaxial cables, copper wire and fiber optics, including the wires that comprise bus 740. Transmission media can also take the form of acoustic or light waves, such as those generated during radio-wave and infra-red data communications.

Various forms of media may be involved in carrying one or more sequences of one or more instructions to processor 742 for execution. For example, the instructions may initially be carried on a magnetic disk or solid state drive of a remote computer. The remote computer can load the instructions into its dynamic memory and send the instructions over a telephone line using a modem. A modem local to computer system 700 can receive the data on the telephone line and use an infra-red transmitter to convert the data to an infra-red signal. An infra-red detector can receive the data carried in the infra-red signal and appropriate circuitry can place the data on bus 740. Bus 740 carries the data to main memory 744, from which processor 742 retrieves and executes the instructions. The instructions received by main memory 744 may optionally be stored on storage device 748 either before or after execution by processor 742.

Computer system 700 also includes a communication interface 756 coupled to bus 740. Communication interface 756 provides a two-way data communication coupling to a network link 758 that is connected to a local network 760. For example, communication interface 756 may be an integrated services digital network (ISDN) card, cable modem, satellite modem, or a modem to provide a data communication connection to a corresponding type of telephone line. As another example, communication interface 756 may be a local area network (LAN) card to provide a data communication connection to a compatible LAN. Wireless links may also be implemented. In any such implementation, communication interface 756 sends and receives electrical, electromagnetic or optical signals that carry digital data streams representing various types of information.

Network link 758 typically provides data communication through one or more networks to other data devices. For example, network link 758 may provide a connection through local network 760 to a host computer 762 or to data equipment operated by an Internet Service Provider (ISP) 764. ISP 764 in turn provides data communication services through the world wide packet data communication network now commonly referred to as the "Internet" 766. Local network 760 and Internet 766 both use electrical, electromagnetic or optical signals that carry digital data streams. The signals through the various networks and the signals on network link 758 and through communication interface 756, which carry the digital data to and from computer system 700, are example forms of transmission media.

Computer system 700 can send messages and receive data, including program code, through the network(s), network link 758 and communication interface 756. In the Internet example, a server 768 might transmit a requested code for an application program through Internet 766, ISP 764, local network 760 and communication interface 756.

The received code may be executed by processor 742 as it is received, and/or stored in storage device 748, or other non-volatile storage for later execution.

The embodiments discussed herein to illustrate the disclosed techniques should not be considered limiting and only provide examples of implementation. For example, instead of or in addition to obtaining full maps of a subset of surfaces, sparse maps may be acquired off all surfaces, which are then improved using the neural network to complete the maps. Those skilled in the art will understand the other myriad ways of how the disclosed techniques may be implemented, which are contemplated herein and are within the bounds of the disclosure.

An example method for generating data for three-dimensional reconstructions at least includes exposing a subsequent surface of a sample, acquiring an image of the subsequent surface, comparing the image of the subsequent surface to an image of a reference surface, based on the comparison exceeding a threshold, acquiring a compositional or crystalline map of the subsequent surface, and based on the comparison not exceeding the threshold, exposing a next surface.

The example method of above further include acquiring the image of the reference surface, and acquiring a crystalline or compositional map of the reference surface.

The example methods of above further including acquiring an image of the next surface, comparing the image of the next surface to the reference image, based on the comparison exceeding a threshold, acquiring a compositional or crystalline map of the next surface, and based on the comparison not exceeding the threshold, exposing an additional surface.

The example methods of above, where comparing the image of the subsequent surface to an image of a reference image includes determining whether a difference between the images is greater than the threshold.

The example methods of above, where exposing a subsequent surface includes milling, by a focused ion beam, a layer from the sample, the subsequent surface exposed upon milling of the layer.

The example methods of above further including repeating the steps of exposing, acquiring and comparing for a plurality of surfaces, wherein a subset of surfaces of the plurality of surfaces will have an associated image and an associated crystalline or compositional map, and wherein a remainder of surfaces of the plurality of surfaces will have an associated image.

The example methods of above further including propagating, using one or more neural networks, crystalline or compositional maps to the remainder of surfaces of the plurality of surfaces.

The example methods of above, where propagating, using one or more neural networks, crystalline or compositional maps to the remainder of surfaces of the plurality of surfaces includes interpolating, using the one or more neural networks, the crystalline or compositional maps from the subset of surfaces of the plurality of surfaces to form the crystalline or compositional maps for the remainder of surfaces of the plurality of surfaces.

The example methods of above, where propagating, using one or more neural networks, crystalline or compositional maps to the remainder of surfaces of the plurality of surfaces includes associating, using the one or more neural networks, a pixel value of a crystalline or compositional map of an individual surface of the subset of surfaces with a pixel value of an image of the individual surface of the subset of surfaces, and assigning, using the one or more neural networks, a pixel value for a crystalline or compositions map to a pixel value of an image of one of the remainder surfaces based on associated pixel values.

The example methods of above, where at least the process of comparing the image of the subsequent surface to an image of the reference surface is performed by a neural network.

The example methods of above, where acquiring an image of the subsequent surface includes acquiring, with an electron beam or a focused ion beam, an image of the subsequent surface.

The example methods of above, where acquiring a compositional or crystalline map of the subsequent surface includes acquiring, using energy dispersive x-ray spectroscopy or cathodoluminescence, the composition map of the subsequent surface, and acquiring, using electron backscatter diffraction, the crystalline map of the subsequent surface.

The example methods of above further including acquiring a sparse compositional or crystalline map of the subsequent surface An example apparatus for generating data for three-dimensional reconstructions at least includes an electron column coupled to provide an electron beam, a focused ion beam column coupled to provide an focused ion beam, at plurality of detectors arranged to at least detect secondary electrons, x-rays, and backscattered electrons, and a controller coupled to at least the electron column, the focused ion beam column and each detector of the plurality of detectors. The controller including or coupled to code that, when executed by the controller, causes the apparatus to expose, by the focused ion beam, a subsequent surface of a sample, acquire an image of the subsequent surface, compare the image of the subsequent surface to a reference image, the reference image an image of a reference surface, based on the comparison exceeding a threshold, acquire a compositional or crystalline map of the subsequent surface, and based on the comparison not exceeding the threshold, expose a next surface.

The example apparatus of above, where the controller further includes or is coupled to code that, when executed by the controller, causes the apparatus to acquire an image of the reference surface, and acquire a crystalline or compositional map of the reference surface.

The example apparatus of above, where the controller further includes or is coupled to code that, when executed by the controller, causes the apparatus to acquire an image of the next surface, compare the image of the next surface to the reference image, based on the comparison exceeding a threshold, acquire a compositional or crystalline map of the next surface, and based on the comparison not exceeding the threshold, expose a subsequent surface.

The example apparatus of above, where comparing the image of the subsequent surface to a reference image includes determining whether a difference between the images is greater than the threshold.

The example apparatus of above, where the controller further includes or is coupled to code that, when executed by the controller, causes the apparatus to repeat the steps of exposing, acquiring and comparing for a plurality of surfaces, wherein a subset of surfaces of the plurality of surfaces will have an associated image and crystalline or compositional map, and wherein a remainder of surfaces of the plurality of surfaces will have an associated image.

The example apparatus of above, where the controller further includes or is coupled to code that, when executed by the controller, causes the apparatus to propagate, using one or more neural networks, crystalline or compositional maps to the remainder of surfaces of the plurality of surfaces.

The example apparatus of above, where the controller further includes or is coupled to code that, when executed by the controller, causes the apparatus to interpolate, using the one or more neural networks, the crystalline or compositional maps from the subset of surfaces of the plurality of surfaces to form the crystalline or compositional maps for the remainder of surfaces of the plurality of surfaces.

The example apparatus of above, where the controller further includes or is coupled to code that, when executed by the controller, causes the apparatus to associate, using the one or more neural networks, a pixel value of a crystalline or compositional map of an individual surface of the subset of surfaces with a pixel value of an image of the individual surface of the subset of surfaces, and assign, using the one or more neural networks, a pixel value for a crystalline or compositions map to a pixel value of an image of one of the remainder surfaces based on associated pixel values.

The example apparatus of above, where the controller includes or is coupled to one or more neural networks trained to compare step the image of the subsequent surface to a reference image, the reference image an image of a reference surface, and, based on the comparison, provide control signals to the apparatus.

The example apparatus of above, where the controller further includes or is coupled to code that, when executed by the controller, causes the apparatus to acquire, using energy dispersive x-ray spectroscopy or cathodoluminescence, the composition map of the subsequent surface, and acquire, using electron backscatter diffraction, the crystalline map of the subsequent surface.

The apparatus of claim above, where the controller further includes or is coupled to code that, when executed by the controller, causes the apparatus to acquire a sparse compositional or crystalline map of the subsequent surface.

What is claimed is:

1. A method comprising:
    providing, by an electron column, an electron beam;
    exposing, by a focused ion beam provided by a focused ion beam column, a subsequent surface of a sample;
    acquiring, by a plurality of detectors arranged to at least detect secondary electrons, x-rays, and backscattered electrons, an image of the subsequent surface; and
    selectively determining, via a controller coupled to the electron column, the focused ion beam column, and each of the plurality of detectors, whether to acquire a compositional or crystalline map of the subsequent surface by:
    comparing the image of the subsequent surface to an image of a reference surface; based on the comparison exceeding a threshold, acquiring the compositional or crystalline map of the subsequent surface; and
    based on the comparison not exceeding the threshold, exposing a next surface of the sample without acquiring the compositional or crystalline map of the subsequent surface.

2. The method of claim 1, further comprising:
    acquiring an image of the next surface;
    comparing the image of the next surface to the reference image;
    based on the comparison exceeding a threshold, acquiring a compositional or crystalline map of the next surface; and
    based on the comparison not exceeding the threshold, exposing an additional surface.

3. The method of claim 1, further comprising:
    repeating the steps of exposing, acquiring and determining for a plurality of surfaces, wherein a subset of surfaces of the plurality of surfaces will have an associated image and an associated crystalline or compositional map, and wherein a remainder of surfaces of the plurality of surfaces will have an associated image without an associated crystalline or compositional map.

4. The method of claim 3, further comprising:
    propagating, using one or more neural networks, crystalline or compositional maps to the remainder of surfaces of the plurality of surfaces.

5. The method of claim 4, wherein propagating, using one or more neural networks, crystalline or compositional maps to the remainder of surfaces of the plurality of surfaces comprises:
    interpolating, using the one or more neural networks, the crystalline or compositional maps from the subset of surfaces of the plurality of surfaces to form the crystalline or compositional maps for the remainder of surfaces of the plurality of surfaces.

6. The method of claim 4, wherein propagating, using one or more neural networks, crystalline or compositional maps to the remainder of surfaces of the plurality of surfaces comprises:
    associating, using the one or more neural networks, a pixel value of a crystalline or compositional map of an individual surface of the subset of surfaces with a pixel value of an image of the individual surface of the subset of surfaces; and
    assigning, using the one or more neural networks, a pixel value for a crystalline or compositions map to a pixel value of an image of one of the remainder surfaces based on associated pixel values.

7. The method of claim 1, wherein at least the process of comparing the image of the subsequent surface to an image of the reference surface is performed by a neural network.

8. The method of claim 1, further including:
    acquiring a sparse compositional or crystalline map of the subsequent surface.

9. An apparatus comprising:
    an electron column coupled to provide an electron beam;
    a focused ion beam column coupled to provide an focused ion beam;
    a plurality of detectors arranged to at least detect secondary electrons, x-rays, and backscattered electrons; and
    a controller coupled to at least the electron column, the focused ion beam column and each detector of the plurality of detectors, the controller including or coupled to code stored in non-transitory storage media that, when executed by the controller, causes the apparatus to:
    expose, by the focused ion beam, a subsequent surface of a sample;
    acquire an image of the subsequent surface; and
    selectively determine whether to acquire a compositional or crystalline map of the subsequent surface by:
    comparing the image of the subsequent surface to a reference image, the reference image an image of a reference surface;
    based on the comparison exceeding a threshold, acquiring the compositional or crystalline map of the subsequent surface; and
    based on the comparison not exceeding the threshold, exposing a next surface of the sample without acquiring the compositional or crystalline map of the subsequent surface.

10. The apparatus of claim 9, wherein the code, when executed by the controller, further causes the apparatus to:

acquire an image of the next surface;

compare the image of the next surface to the reference image;

based on the comparison exceeding a threshold, acquire a compositional or crystalline map of the next surface; and based on the comparison not exceeding the threshold, expose a subsequent surface.

11. The apparatus of claim 9, wherein the code, when executed by the controller, further causes the apparatus to:

repeat the steps of exposing, acquiring and selectively determining for a plurality of surfaces, wherein a subset of surfaces of the plurality of surfaces will have an associated image and an associated crystalline or compositional map, and wherein a remainder of surfaces of the plurality of surfaces will have an associated image without an associated crystalline or compositional map.

12. The apparatus of claim 11, wherein the code, when executed by the controller, further causes the apparatus to:

propagate, using one or more neural networks, crystalline or compositional maps to the remainder of surfaces of the plurality of surfaces.

13. The apparatus of claim 12, wherein propagating, using one or more neural networks, crystalline or compositional maps to the remainder of surfaces of the plurality of surfaces comprises:

interpolating, using the one or more neural networks, the crystalline or compositional maps from the subset of surfaces of the plurality of surfaces to form the crystalline or compositional maps for the remainder of surfaces of the plurality of surfaces.

14. The apparatus of claim 11, wherein propagating, using one or more neural networks, crystalline or compositional maps to the remainder of surfaces of the plurality of surfaces comprises:

associating, using the one or more neural networks, a pixel value of a crystalline or compositional map of an individual surface of the subset of surfaces with a pixel value of an image of the individual surface of the subset of surfaces; and assigning, using the one or more neural networks, a pixel value for a crystalline or compositions map to a pixel value of an image of one of the remainder surfaces based on associated pixel values.

15. The apparatus of claim 9, wherein the code, when executed by the controller, further causes the apparatus to:

acquire a sparse compositional or crystalline map of the subsequent surface.

16. The apparatus of claim 9, wherein the code, when executed by the controller, further causes the apparatus to, based on the comparison exceeding the threshold, identify a new reference image, wherein the new reference image is compared to an acquired image of the next surface.

17. The apparatus of claim 16, wherein the new reference image is an image of the subsequent surface.

* * * * *